United States Patent
Widdershoven et al.

(10) Patent No.: US 6,331,947 B1
(45) Date of Patent: Dec. 18, 2001

(54) NON-VOLATILE MOS RAM CELL WITH CAPACITOR-ISOLATED NODES THAT ARE RADIATION ACCESSIBLE FOR RENDERING A NON-PERMANENT PROGRAMMED INFORMATION IN THE CELL A NON-VOLATILE ONE

(75) Inventors: Franciscus P. Widdershoven; Anne J. Annema; Maurits M. N. Storms; Marcellinus J. M. Pelgrom, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/678,456

(22) Filed: Oct. 3, 2000

(30) Foreign Application Priority Data

Oct. 4, 1999 (EP) .................................. 99203238

(51) Int. Cl.[7] .................................. G11C 16/00
(52) U.S. Cl. .................... 365/185.08; 365/104; 365/149; 365/154
(58) Field of Search .......................... 365/154, 104, 365/94, 106, 149, 185.08

(56) References Cited

U.S. PATENT DOCUMENTS

| | | | |
|---|---|---|---|
| 4,095,281 | * 6/1978 | George | 365/154 |
| 4,384,287 | * 5/1983 | Hiraku | 326/121 |
| 4,471,471 | * 9/1984 | Dimaria | 365/185.08 |
| 4,545,035 | * 10/1985 | Gutterman et al. | 365/185.08 |
| 4,611,309 | * 9/1986 | Chuang et al. | 365/185.08 |
| 6,021,066 | * 2/2000 | Lam | 365/185.08 |
| 6,064,590 | * 5/2000 | Han et al. | 365/185.08 |
| 6,141,248 | * 10/2000 | Forbes et al. | 365/185.08 |

* cited by examiner

Primary Examiner—Tan T. Nguyen
(74) Attorney, Agent, or Firm—Steven R. Biren

(57) ABSTRACT

A non-volatile, random access memory cell comprises first and second inverters each having an output node cross-coupled by cross-coupling means to an input node of the other inverter for forming a MOS RAM cell. The output node of each inverter is selectively connected via the conductor paths of separate access transistors to respective bit lines. The control electrodes of the access transistors are connected to a common word line. In particular, both RAM and programmable Read-Only operation of said memory cell are provided. Thereto, the cross-coupling comprises capacitors (C1, C2) each in series with a control electrode of a respective p-type transistor of the first and second inverters. This renders both interconnecting nodes between a capacitor and the gate electrode of its associated p-channel transistor floating. Isolators around these nodes render the cell data-retentive. The nodes are transiently and electrically programmable through signals on the bit and word lines of the cell. The nodes are radiation-accessible for internal photo-emission inducing short-wave radiation, that renders a non-permanent programmed information in the cell a non-volatile one.

11 Claims, 3 Drawing Sheets

NVSRAM cell

NON-VOLATILE MOS RAM CELL WITH CAPACITOR-ISOLATED NODES THAT ARE RADIATION ACCESSIBLE FOR RENDERING A NON-PERMANENT PROGRAMMED INFORMATION IN THE CELL A NON-VOLATILE ONE

BACKGROUND OF THE INVENTION

The invention relates to an integrated circuit with a non-volatile random access memory cell. The art of designing standard CMOS memories has experienced the usefulness of memory cells that would feature battery-less storage retention combined with the selective programmability thereof. Such would enhance the flexibility of the overall memory. In the ambit of the present invention this feature will be termed "non-volatility", and the invention thereby provides NVSRAMs and NVDRAMs. In contradistinction thereto, battery-supported non-volatility will not be considered herein. The cell configuration considered hereinafter should be programmable in a relatively late stage of the manufacturing process, as distinguished from mask-programmed ROMs that are programmed on a batch level through modifying the geometrical configuration of a cell, or of an array of such cells. In fact, the programming of the present invention is effectable during the post-manufacturing test phase. Moreover, the programming should not need the providing of additional bondings etcetera, such as would be necessary for fuse-programming. In fact, the latter scheme is feasible only for low numbers of programmable cells.

U.S. Pat. No. 4,095,281 describes a memory cell that includes a pair of floating-gate memory devices in its load circuit. This feature provides the capability of non-volatile data storage and by itself may be termed an NVSRAM. However, although the operation of the device appears suitable, the additional floating gates necessitate a series of extra process steps that by themselves would be necessary only for the relatively low number of programmable cells. In consequence, the manufacturing process is relatively uneconomical.

In prior art in general, the major part of an electronic circuit may be manufactured in a standard CMOS process, whilst incorporating several programmable non-volatile memory cells. Using the programmability feature would necessitate however to implement all of the circuit by therein incorporating the appropriate non-volatility option, which renders the chip more expensive. According to the present invention, costs may be lowered through executing also the programmable cells in a standard process, even if this would mean that their size could be appreciably greater than that of the standard cells. In fact, such applies in particular if the number of programmable cells will make up only a small fraction of the overall number of cells.

Potential applications of the feature of the present invention would include the storing of option bits for selectively enabling or non-enabling certain functions in a circuit, storing version numbers and various other identifiers or codes, storing calibration bits for specifying certain analog circuit parameters and modifying of programmed code in a mask ROM. A particular feature of the present invention is that the programming of larger numbers of bits may be effected by inputting them into the SRAM or DRAM through a standard data communication feature such as a data bus. Such bus is clearly a fast communication facility. Eventually, the programming will be made non-volatile or "frozen-in" by an ultra-violet radiation pulse. Also this programming operation may be effected in a fast manner because it could in principle be a parallel mechanism.

SUMMARY TO THE INVENTION

In consequence, amongst other things, it is an object of the present invention to provide a memory cell having the above identified facilities that are attained through modifying the static electronic configuration, rather than modifying the geometrical configuration. Preferably, the processing should still be based on that of the standard PMOS or CMOS cell. This allows to program the circuitry after the batch or wafer level manufacturing procedure has ended, although there is no intrinsic need to delay the said programming to such instant where the various memory-based items will have been mechanically separated into chips, IC-packages, or the like.

Now therefore, according to one of its aspects the invention is characterized according to claim 1.

The invention also relates to a memory based device that combines non-volatile memory cells with standard cells. Further advantageous aspects of the invention are recited in dependent Claims.

BRIEF DESCRIPTION OF THE DRAWING

These and further aspects and advantages of the invention will be discussed more in detail hereinafter with reference to the disclosure of preferred embodiments, and in particular with reference to the appended Figures that show.

DETAILED DESCRIPTION OF PREFERRED EMBODIMENTS

Figure 1:
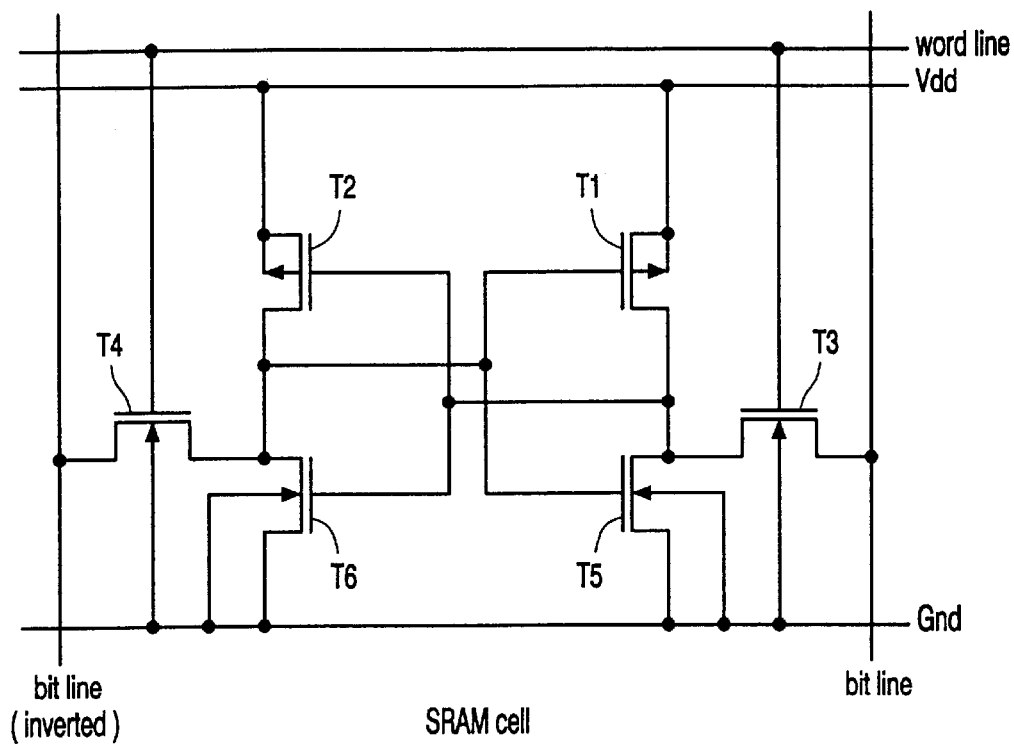
FIG. 1, a prior art six-transistor SRAM cell.

FIG. 1 shows a prior art SRAM cell, that has two identical inverters. The first inverter consists of p-channel T1 and n-channel T5 and is connected to the output of the second inverter consisting of p-channel T2 and n-channel T6. The input of the second inverter is connected to the output of the first inverter. The circuit has two stable states with the output of the first inverter high or "state 1", and low or "state 0", respectively. For these states the output of the second inverter is low and high, respectively. A transition from state 1 to state 0 can be induced through a high voltage on the gates of n-channel access transistors T3 and T4, i.e. on the word line, while keeping the bit line connected to T3 at a low voltage and the inverted bit line connected to T4 floating or at a high voltage.

Now, if in particular both the bit line and the inverted bit line are at a low voltage while selecting the cell, the word line then being at a high voltage, the outputs of both inverters will be low. As long as the cell remains selected, and the current drive capability of transistors T3 and T4 is high enough in comparison to that of T1 and T2, this is a stable situation. The situation will only become unstable when the word line returns to a high voltage. Thereupon, the cell state will eventually go to either "0" or to "1", in dependence on the electronic mismatch between the two inverters and the access transistors. Because of the symmetry of the cell, it will feel interference signals like substrate bouncing and cross-talk as common mode signals. In general consequence, a small actual mismatch will drive the cell always to the same stable state. In fact, the mismatch is detected locally by the cell itself.

Figure 2:
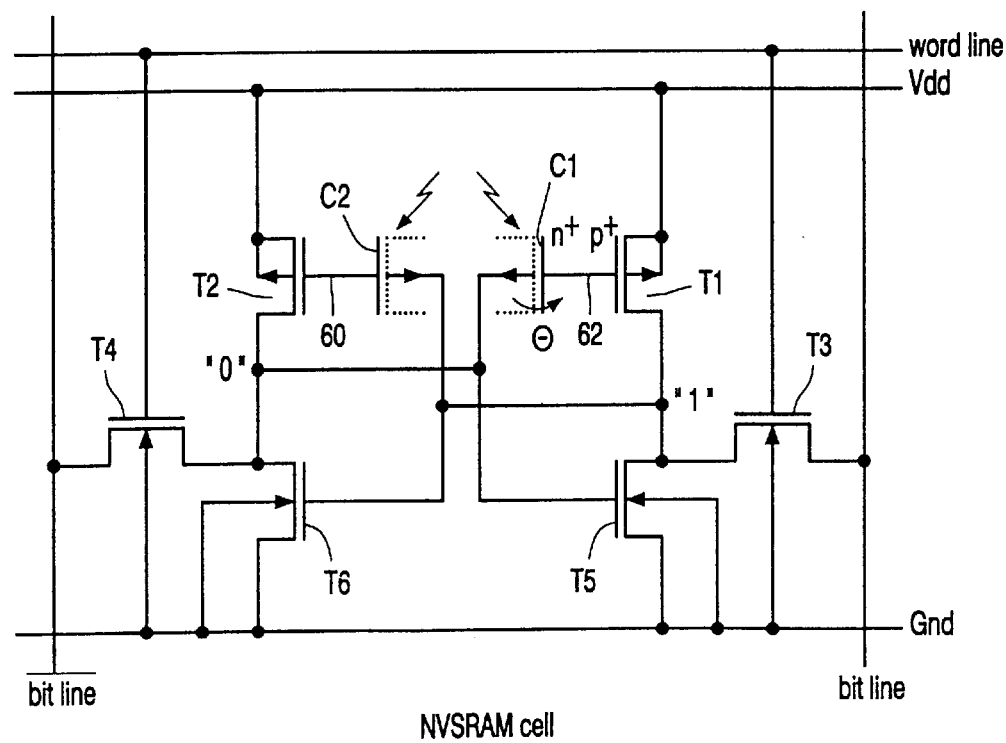
FIG. 2, a Non-Volatile SRAM cell according to the invention.

FIG. 2 shows a Non-Volatile SRAM cell that has been modified according to the present invention. The arrangement has additional capacitors C1 and C2 that are in series with the gates of the p-channels T1 and T2; however, the adding of these transistors does not require extra process steps. Each of these capacitors has one polysilicon electrode, and a second electrode that is formed by an n-well like in the case of a p-channel MOST. The two electrodes are separated by a gate oxide. Therefore, the structure of both capacitors has a certain similarity with p-channel transistors, of which both source and drain implants have been left out. However, the polysilicon of the transistors is doped n-type, to make the built-in voltage between polysilicon electrode and n-well as small as possible. In fact, p-type doping is feasible, but somewhat less attractive. Now, the symbol that has been used for capacitors C1 and C2 is based on their similarity with p-channel transistors, with the absent inversion channel, source and drain being shown through dashed lines. The polysilicon electrode of each capacitor is connected to the gate polysilicon electrode of the associated p-channel transistor. To raise the charge retention properties of the floating gate, this connection is made on the polysilicon level, i.e. the gates and the capacitor electrodes are made of one continuous piece of polysilicon, without providing contacting metal interconnects. Somewhere between the p-channel and the capacitor the doping of the polysilicon should change from p-type to n-type. The resulting p-n-junction may however be short-circuited by a silicide layer on top of the polysilicon. An alternative solution is to leave out this silicide layer altogether, which would then produce a non-shorted $p^+$-$n^+$-transition, that could even improve data retention. The junction leakage of such a diode would be more than sufficient to allow connecting the $p^+$-part of the poly to the $n^+$-part, especially, if the junction operates as a tunnel diode.

If the two capacitors are identical, and the two floating gates have the same charges, then the modified cell of FIG. 2 will still be symmetrical, and will behave similarly to that of FIG. 1. However, injecting a negative charge on one of the floating gates may change the symmetry, will cause the cell to always go to the same state after it has been selected through a low voltage on both the bit line and the inverted bit line. Injecting a charge on one of the floating gates may thus be used to program the cell of FIG. 2 in a non-volatile manner. This may be done as follows. First, the cell is programmed in a conventional manner into one of its stable states, for example in state "1". This state will be lost when the supply voltage disappears. In state "1" a high electric field in the gate oxide of capacitor C1 will point from the floating polysilicon electrode to the n-well, at a strength that depends on the supply voltage, on the ratio between the gate capacitance of T1 and the capacitance of C1, and on the initial charge on the floating gate electrode of T1. In turn, the latter charge depends on the processing conditions during the manufacturing of the circuit and on the conduction types of the floating polysilicon electrode at the gate of T1 and at the floating plate of C1, respectively. In the case of opposite conduction types, the two regions of the polysilicon electrode may be short-circuited by silicidation of the polysilicon. Generally, an initial charge will be relatively small in absolute value and the electric field in the gate oxide of C1 will be determined mainly by the supply voltage and by the ratio between the capacitances. The electric field across the gate oxide of C2 will be less, because the two electrodes of C2 have approximately the same voltage.

For a "freeze-in" of the data state, the two capacitors may now be exposed to Ultra Violet or similar light of a sufficiently short wavelength, such as the same that is generally used to erase EPROM memories, e.g. the 256 nm line of a low pressure mercury discharge lamp. This will induce internal photo-emission, so that electrons in the accumulation layer of the n-well of C1 will be aided by the UV light to traverse the potential barrier of the gate oxide, and thence to move to the floating gate electrodes of C1 and of T1. Because in C2 the electric field strength in the gate oxide will be much lower than in C1, the charge transport across the gate oxide of C2 will be negligible as compared to that in C1. It should be noted, that the programming radiation as specified generally cannot pass through layers made of matter such as poly, silicide, nitride, or metal, but should be made to pass through the relatively thick layer of field isolation to reach the gate oxide of capacitors C1 and C2. On the other hand, for preventing electrons that have been injected on a floating gate from leaving it by traversing the gate oxide of the corresponding p-channel, precautions must be taken for preventing the various p-channels from being exposed to the UV light, such as through covering critical parts of the p-channels by a metal layer. Generally, the circuit will be covered by a final scratch-protection layer. This layer must then be made UV-transparent at the locations that are used for programming the circuit. Applicable UV-transparent materials have been in public use.

Now, the injection of electrons on the gate of T1 will lower the potential of that gate relative to that of the gate of T2 and render the cell asymmetric, which stabilizes the actual "1" state. Once the asymmetry will have become strong enough, the UV light may be switched off. If subsequently the cell is accessed with a low voltage on both the bit line and the inverted bit line, the cell will always evolve to the "1" state after the word line has become low again, implying that the originally volatile state has now become non-volatile. For practical applications of non-volatility, the time constant of the data retention should be in the range of weeks to years, in accordance with the applicable field of use.

The programming mechanism described allows to first electrically program multiple NVSRAMs in a conventional volatile manner, and subsequently illuminate all NVSRAM cells simultaneously by UV radiation to turn each volatile state in its corresponding non-volatile state. The advantage of this scheme is that conventional addressing circuitry may be used to program an array of NVSRAM cells. This allows to apply the method also for relatively large memory arrays without unacceptably increasing the number of bond pads. A particular application of the present invention may lay in supplementing a large circuit that operates at a lower voltage with additional I/O circuitry that operates at a relatively higher voltage for better interfacing with external circuits. This allows to use the improved cells of the present invention for all or part of the memory provided with this I/O circuitry. On the other hand, the cells of the invention may be used throughout various parts of a comprehensive circuit.

Figure 3:
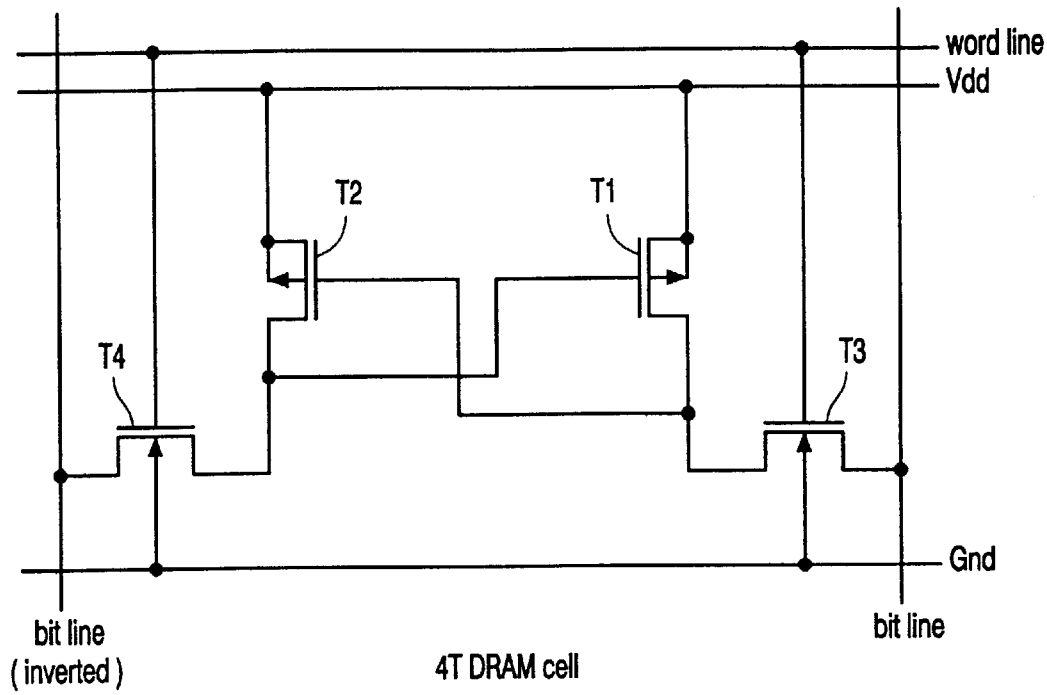
FIG. 3, a prior art four-transistor DRAM cell.

FIG. 3 shows a prior art four-transistor DRAM cell, that may be derived from the SRAM cell in FIG. 1 by removing n-channel transistors T5 and T6. This reduces the number of transistors, but also removes the static character of an SRAM cell, that now becomes dynamic instead. The state of the cell is determined by the amount of charge that is stored on the gate of one of the p-channels. The cell may be programmed in the same way as the SRAM cell in FIG. 1. In a non-selected DRAM cell that is in state "1", transistor T1 has sufficient negative charge on its gate electrode to render T1 conducting. As a result, the gate-to-source capacitance of T2 will be short-circuited and T2 will become non-conducting or off. This in turn will prevent the charge on the gate-to-source capacitance of T1 from leaking away via the drain of T2. However, because of residual current, the charge on the gate of T1 will not be stable on a long term. Therefore, the DRAM cell must be repeatedly refreshed for maintaining its state. This may be done by selecting the cell through a positive voltage on its word line, while the bit line and inverted bit line are connected to ground by means of mutually equal resistors. In the selected state, the p-channel T1 together with the resistor connected to its drain via the access transistor T3 form an inverter. The same applies to T2 and its associated resistor. During the above selected state, the two inverters together form an SRAM, comparable to that of FIG. 1, be it with the n-channels T5 and T6 replaced by resistors. If their resistance values are high enough, the SRAM cell is bistable, and its state will evolve to the nearest of its two stable states. In this way, the cell's state will be completely refreshed. After deselection, the cell returns to operating as a DRAM cell.

The DRAM cell of FIG. 3 has similar advantages as the SRAM cell in FIG. 1. Its state is detected locally during read-out or refresh, which renders the cell relatively robust against interference like cross-talk and substrate-bounce. When refreshing a non-programmed cell, the mismatch between the cell's transistors will determine its eventual state, just as for the SRAM cell of FIG. 1.

Figure 4:
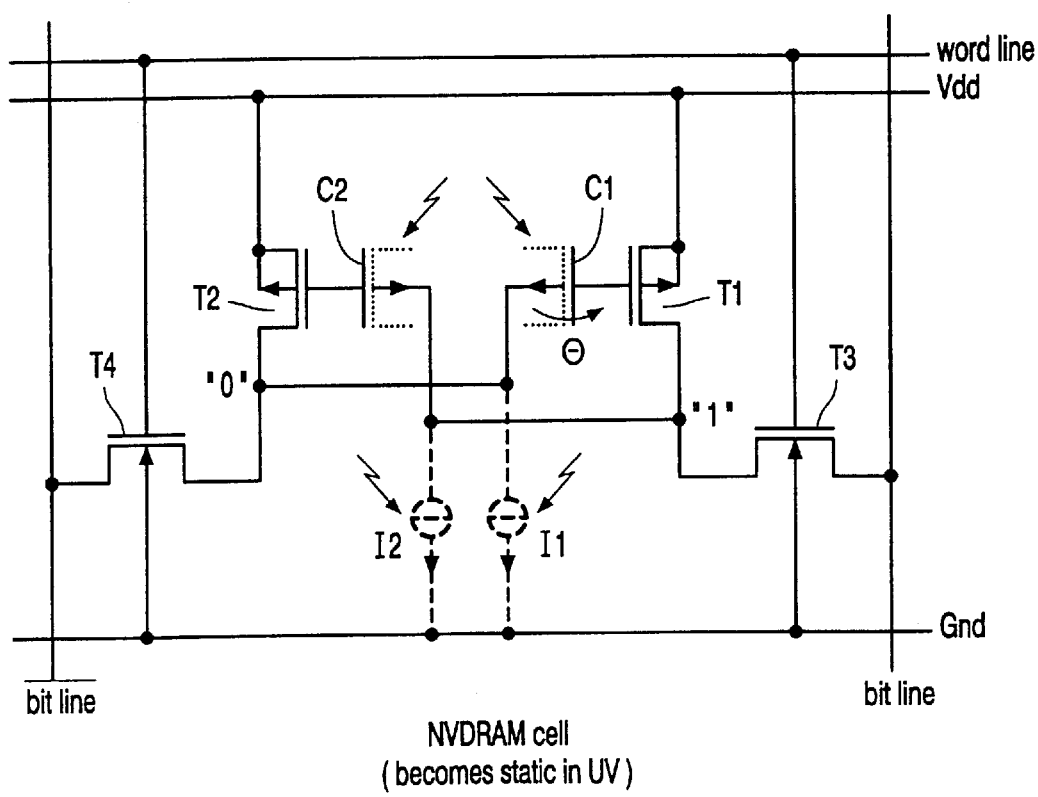
FIG. 4, a Non-Volatile DRAM cell according to the invention.

FIG. 4 shows a battery-less four-transistor Non-Volatile DRAM cell according to the present invention, which will hereinafter be called a NVDRAM. The modifications correspond to those of FIG. 2. The state of a programmed NVDRAM cell may be rendered non-volatile by exposing it to UV light according to the same procedure described with reference to FIG. 2. Writing data into an array of NVDRAM cells may be done either in the dark or with the UV radiation already turned on, provided such does not disturb the peripheral electronic circuitry. During writing in the dark, the stored data will remain volatile and will have to be refreshed to prevent data loss. However, once the UV light will have been switched on, the NVDRAM cell will become a static cell. This is caused by the UV photocurrents that are collected by the n-wells of the two capacitors C1 and C2. These photocurrents are represented by the current sources I1 and I2 in FIG. 4. The currents themselves have been shown in a dashed manner to express their temporary character, inasmuch as they are present only when the UV is on. As a consequence, it is no longer necessary to refresh data in an NVDRAM array provided the UV is on. If furthermore, the original data writing is also done in UV light, one doesn't even need to refresh at all during programming.

After switching off the UV light, the charges stored at the drain nodes of the NVDRAM's p-channel transistors will be lost. However, the charge that has been injected on the floating gate nodes of the p-channel transistors makes the cell asymmetrical. If such a cell is reset, it will always evolve to the same state, just like in the case of the NVSRAM cell of FIG. 2.

The refreshing method described hereabove serves only as an example. Various more advanced methods do exist and may be implemented as an alternative to or in combination with the above, as would be apparent to a person skilled in the art. It is feasible as well to use p-type access transistors instead of the n-type transistors disclosed in FIGS. 3 and 4. In the case of the NVDRAM, this would make the circuit a PMOS circuit. Note that T1 and T2 are always p-channel.

Furthermore, in principle NVSRAM and NVDRAM cells in which non-volatile data have been stored may still be used as conventional SRAM and DRAM cells, respectively, provided only that the UV-light induced asymmetry is not too high. It is anticipated that in many practical instances this would represent a compatible solution. In such double-usage cells, the non-volatile data may, for example, be used to store initial states, such as boot data sequences or default data values. If necessary, these non-volatile data may be overwritten again later.

In the preferred embodiments disclosed hereabove, the conduction type of the floating polysilicon at the floating plates of C1 and C2 should be n-type, with a donor concentration that is much higher than the one in the in the n-well plates of C1 and of C2. In this manner, the built-in difference in potential between the capacitor plates of C1 and C2 will be almost zero, while for a cell in the "1" state, there will only be a negligible gate depletion in the polysilicon gate of C1. This will help to make the electric field strength in the gate oxide of C1 high, whilst keeping that in C2 almost zero. For a cell in the opposite state however, the same will hold with the roles of C1 and C2 interchanged. The mapping between the logic state of a complete memory cell on the one hand, and the logic state of a particular data node on the other should of course be apparent.

Figure 5:
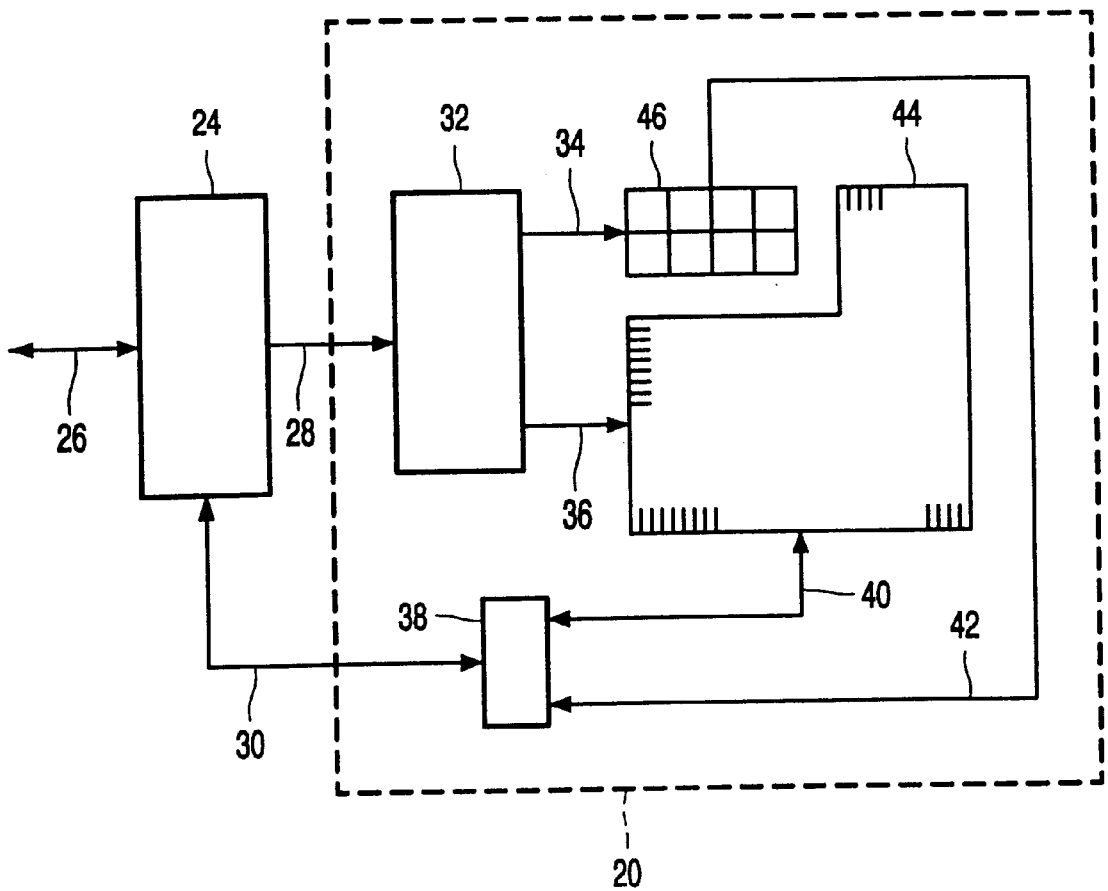
FIG. 5, a memory based device that combines Non-volatile cells with standard cells.

FIG. 5 shows a memory based device 20 according to the present invention, which combines non-volatile memory cells 46 with standard memory cells 44. The memory-based device may include various processing or other non-memory devices, and also further memory arrays not pertinent to the invention. In the figure, device 20 is subaltern to a control device 24 that provides addresses on line 28 and communicates data on line 30. Furthermore, device 24 is connected to an unspecified outer world through line 26. Multiplexer 38 has a bidirectional path 40 connected to standard cell array 44, and furthermore receives data from non-volatile memory cell array 46 through data path 42. The addresses on line 28 are received by address decoder 32 for through line 34 selectively addressing the nonvolatile memory cell array 46, and through line 36 likewise selectively addressing standard cell array 44. The non-volatile memory cells are larger than the standard memory cells, which has been indicated clearly in the Figure. Without restriction, the size ratio could be in the region of 2–10. The overall area of the non-volatile cells could run to some 10% or less of total area. For simplification, timing, powering, and multiplexer control have been suppressed in the representation, such suppressing also including the associated interconnections.

What is claimed is:

1. An integrated circuit comprising a memory with a non-volatile, random access memory cell comprising first and second inverters each having an output node cross-coupled by cross-coupling means to an input node of the other inverter for forming a MOS RAM cell, the output node of each inverter being selectively connected via the conductor paths of separate access transistors to respective bit lines, the control electrodes of said access transistors being connected to a common word line, the cell being arranged for providing both RAM and programmable Read-Only operation of said memory cell, being characterized in that said cross-coupling means comprising respective capacitor means (C1, C2) each in series with a control electrode of a respective p-type transistor of said first and second inverters, to render both interconnecting nodes between a capacitor and the gate electrode of its associated p-channel transistor floating, and through isolators around these nodes render the cell data-retentive, nodes being transiently and electrically programmable through signals on the bit and word lines of the cell in question, and in that said nodes are radiation-accessible for internal photo-emission inducing short-wave radiation, that renders a non-permanent programmed information in said cell a non-volatile one.

2. An integrated circuit claimed in claim 1, wherein said memory cell is executed in a standard MOS manufacturing process without additional constructive layer in addition thereto.

3. An integrated circuit as claimed in claim 1, executed as a CMOS cell in that said access transistors are NMOS.

4. An integrated circuit as claimed in claim 1, wherein such capacitor means have one polysilicon electrode and furthermore an n-well electrode to combine with a p-channel MOST.

5. An integrated circuit as claimed in claim 4, wherein said polysilicon is $n^+$-doped.

6. An integrated circuit as claimed in claim 5, wherein a connection between the control electrode and the capacitor means are interconnected on the polysilicon level and have a short-circuiting silicide layer.

7. An integrated circuit as claimed in claim 1, and have radiation protective means for preventing further p-channels from receiving internal photo-emission inducing radiation.

8. An integrated circuit as claimed in claim 1, wherein said first and second inverters each comprise a series arrangement of two transistors of mutually opposite conductivity type to thereby constitute a nonvolatile static RAM cell.

9. An integrated circuit as claimed in claim 1, wherein said first and second inverters each comprise an arrangement of a single transistor to thereby constitute a nonvolatile dynamic RAM cell.

10. An integrated circuit as claimed in claim 1, and provided with a short-wave radiation transparent scratch protection layer for transmitting said internal photo-emission inducing short-wave radiation.

11. An integrated circuit as claimed in claim 1, that combines a first plurality of non-volatile memory cells like said non-volatile random access memory cell with a second plurality of standard memory cells, and wherein said non-volatile memory cells and said standard memory cells have at least partly shared addressing facilities.

* * * * *